United States Patent
Matsui

(10) Patent No.: US 8,018,263 B2
(45) Date of Patent: Sep. 13, 2011

(54) PULSE GENERATING CIRCUIT AND PULSE WIDTH MODULATOR

(75) Inventor: Shigekane Matsui, Kyoto (JP)

(73) Assignee: Rohm Co., Ltd. (JP)

( * ) Notice: Subject to any disclaimer, the term of this patent is extended or adjusted under 35 U.S.C. 154(b) by 10 days.

(21) Appl. No.: 12/582,551

(22) Filed: Oct. 20, 2009

(65) Prior Publication Data
US 2010/0097113 A1    Apr. 22, 2010

(30) Foreign Application Priority Data

Oct. 20, 2008 (JP) ................. 2008-269605
Oct. 20, 2008 (JP) ................. 2008-269606
Aug. 26, 2009 (JP) ................. 2009-195416

(51) Int. Cl.
*H03K 3/017* (2006.01)
(52) U.S. Cl. ........................ 327/176; 327/172
(58) Field of Classification Search ............... None
See application file for complete search history.

(56) References Cited

U.S. PATENT DOCUMENTS

| 5,537,068 | A  | * | 7/1996  | Konno ........................ 327/115 |
| 5,642,068 | A  | * | 6/1997  | Wojcicki et al. .......... 327/172 |
| 6,831,493 | B2 | * | 12/2004 | Ma ............................... 327/175 |
| 7,378,893 | B1 | * | 5/2008  | Kang ........................... 327/291 |
| 7,839,195 | B1 | * | 11/2010 | Feng et al. ................. 327/175 |

FOREIGN PATENT DOCUMENTS
JP         2008-280298 A      11/2008
* cited by examiner

*Primary Examiner* — Cassandra Cox
(74) *Attorney, Agent, or Firm* — Cantor Colburn LLP

(57) ABSTRACT

A pulse generating unit receives a clock at a predetermined frequency, and generates a pulse signal which transits synchronously with the positive edge of the clock. A flip-flop acquires the pulse signal every time a positive edge occurs in an inverted clock output from the inverter. A logic gate multiplexes the pulse signal and the output of the flip-flop. A selector selects either the output of the logic gate or the pulse signal.

8 Claims, 5 Drawing Sheets

PULSE GENERATING CIRCUIT AND PULSE WIDTH MODULATOR

BACKGROUND OF THE INVENTION

1. Field of the Invention

The present invention relates to a technique for generating a pulse.

2. Description of the Related Art

Pulse width modulation is used to drive and control an electronic circuit controlled by a switching pulse signal, examples of which include a switching regulator, a motor, etc. In pulse width modulation, the electrical state of the electronic circuit is fed back, and the pulse width of the pulse signal is adjusted based upon the feedback signal. In a case in which a switching regulator (DC/DC converter or DC/AC converter) is driven, the pulse width of the pulse signal is adjusted such that the feedback voltage that corresponds to the output voltage matches a predetermined reference voltage. In a case in which a motor is driven, the pulse width is adjusted such that the electric current that flows through a coil of the motor matches a predetermined electric current.

In an arrangement in which the pulse width modulation is provided by means of a digital circuit, a clock signal is generated at a frequency that is sufficiently higher than that of the pulse signal, and the clock signal thus generated is counted by a counter, in count increments that correspond to the pulse width, thereby generating pulses having a desired pulse width.

[Related Art Documents]
[Patent Documents]
[Patent Document 1]

US patent publication 2007/126410A1 Specification

The aforementioned method requires a clock signal generated at a frequency that corresponds to the resolution of the pulse width of the pulse signal. Accordingly, such a method providing high pulse width resolution requires an oscillator which oscillates at a high frequency, leading to increased power consumption by the circuit.

SUMMARY OF THE INVENTION

The present invention has been made in order to solve the aforementioned problem. Accordingly, it is a general purpose of the present invention to provide a pulse width modulator which provides high resolution with low power consumption, and a pulse generating circuit and a delay circuit which can be applied to such a pulse width modulator.

An embodiment of the present invention relates to a pulse generating circuit. The pulse generating circuit comprises: a pulse generating unit which receives a clock at a predetermined frequency, and which generates a pulse signal which transits synchronously with one of the edges (the positive edge) of the clock; an inverter which inverts the clock; a flip-flop which acquires the pulse signal every time one of the edges (the positive edge) occurs in the inverted clock received from the inverter; and a logic gate which multiplexes the pulse signal and the output of the flip-flop.

One of the edges (the positive edge) output from the inverter corresponds to the other edge (the negative edge) of the clock, which is not inverted. Accordingly, the logic gate outputs a signal obtained by delaying the other edge (the negative edge) of the pulse signal by a half cycle of the clock. Thus, such an arrangement is capable of adjusting the pulse width of the pulse signal in increments of half cycles of the clock. In other words, such an arrangement raises the time resolution twofold without the need to raise the clock frequency twofold, thereby providing reduced power consumption.

Also, a pulse generating circuit according to an embodiment may further comprise a selector which selects either the output of the logic gate or the pulse signal. With such an embodiment, the pulse width can be adjusted by switching the selector.

Also, the pulse generating unit may include a counter which counts the aforementioned one of the edges of the clock, and which generates the pulse signal which is maintained at a predetermined level until the count value reaches a predetermined value.

Another embodiment of the present invention relates to a pulse width modulator. The pulse width modulator comprises: the aforementioned pulse generating circuit; and a pulse width control unit which sets the predetermined value for the pulse generating unit.

Such an embodiment provides reduced power consumption.

Yet another embodiment of the present invention relates to a control circuit for a switching regulator. The control circuit comprises: an A/D converter which converts the output voltage of the switching regulator into a digital value; a pulse modulator which generates a pulse signal having a pulse width adjusted such that the digital value output from the A/D converter approaches a predetermined target value; and a driver which drives a switching element included in the switching regulator using the pulse signal output from the pulse modulator. The pulse modulator includes the aforementioned pulse width modulator.

A delay circuit according to an embodiment of the present invention relates to a delay circuit which applies a variable delay to a negative edge of an input pulse. The delay circuit comprises: a delay unit group which includes multiple delay units connected to one another in a cascade manner in which the input pulse is input to the first delay unit; and a logic gate which multiplexes the output signals of the multiple delay units and the input pulse. Each of the delay units has an enable terminal via which an enable signal can be input. When the enable signal is asserted, the delay unit applies a predetermined delay to the pulse signal. On the other hand, when the enable signal is negated, the delay unit is set to the OFF state.

With such an embodiment, the negative edge of the input pulse can be delayed by asserting enable signals that correspond to the required delay amount, and by negating the other enable signals, thereby providing reduced power consumption.

Yet another embodiment of the present invention relates to a pulse width modulator. The pulse width modulator comprises: the aforementioned delay circuit; and a pulse width control unit which generates the enable signal for each of the multiple delay units included in the delay circuit.

Such an embodiment provides reduced power consumption.

Yet another embodiment of the present invention relates to a control circuit for a switching regulator. The control circuit comprises: an A/D converter which converts the output voltage of the switching regulator into a digital value; a pulse modulator which generates a pulse signal having a pulse width adjusted such that the digital value output from the A/D converter approaches a predetermined target value; and a driver which drives a switching element included in the switching regulator using the pulse signal output from the pulse modulator. The pulse modulator includes the aforementioned pulse width modulator.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
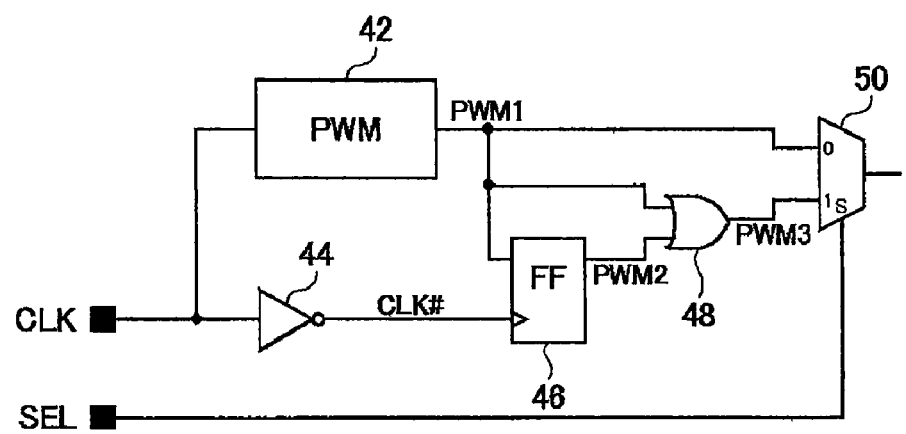
FIG. 1 is a circuit diagram which shows a configuration of a pulse generating circuit according to an embodiment of the present invention.

FIG. 1 is a circuit diagram which shows a configuration of a pulse generating circuit 40 according to an embodiment of the present invention. The pulse generating circuit 40 includes a pulse generating unit 42, an inverter 44, a flip-flop 46, a logic gate 48, and a selector 50.

The pulse generating unit 42 receives a clock CLK at a predetermined frequency, and generates a pulse signal PWM1 which transits synchronously with one of the edges (i.e. a positive edge) of the clock CLK. The inverter 44 inverts the clock CLK, and outputs an inverted clock CLK#.

The pulse generating unit 42 includes a counter which counts one of the edges (the positive edge) of the clock CLK, and which generates a pulse signal PWM which is maintained at a predetermined level (high level) until the count value COUNT reaches a predetermined value N. It should be noted that the pulse generating unit 42 may have a configuration including components other than the counter.

The flip-flop 46 acquires the value of the pulse signal PWM1 every time one of the edges (the positive edge) occurs in the inverted clock CLK# received from the inverter 44. The output PWM2 of the flip-flop 46 is a delayed signal (delayed pulse signal PWM2) obtained by delaying the pulse signal PWM by a half cycle of the clock CLK.

The logic gate 48 has a configuration including an OR gate which outputs the logical sum of multiple input signals, and outputs a signal by delaying the other edge (the negative edge) of the pulse signal by a half cycle.

The selector 50 selects either of the output PWM3 of the logic gate 48 or the pulse signal PWM1 according to the value of a selection signal SEL. Specifically, when the selection signal SEL is "1", the selector 50 selects the output PWM3 of the logic gate 48. When the selection signal SEL is "0", the selector 50 selects the pulse signal PWM1 output from the pulse generating unit 42.

Figure 2:
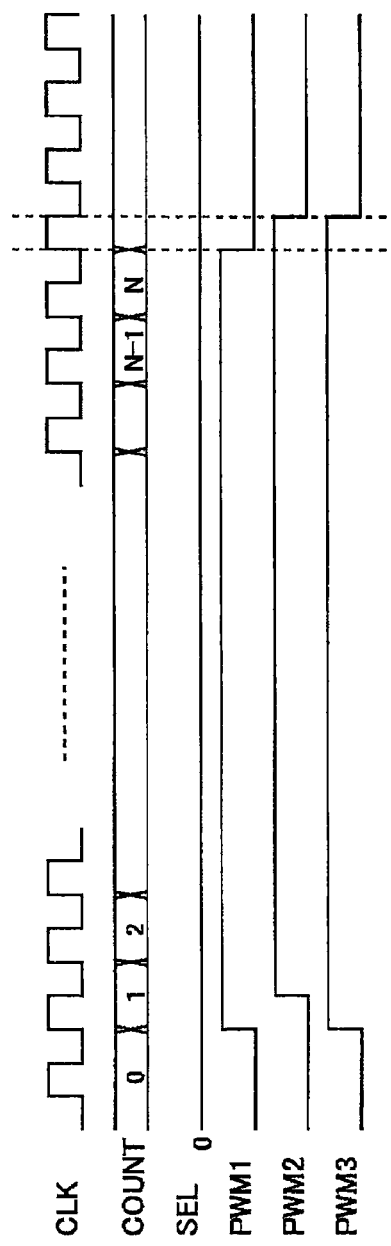
FIG. 2 is a time chart which shows the operation of the pulse generating circuit shown in FIG. 1.

The above is the configuration of the pulse generating circuit 40. Next, description will be made regarding the operation thereof. FIG. 2 is a time chart which shows the operation of the pulse generating circuit 40 shown in FIG. 1. As can be clearly understood from FIG. 2, both the positive edges and the negative edges of the original pulse signal PWM1 occur synchronously with the positive edges of the clock CLK. On the other hand, the negative edges of the pulse signal PWM3 occur synchronously with the negative edges of the clock CLK. In a case in which the pulse signal PWM3 is generated using conventional techniques, there is a need to raise the frequency of the clock CLK twofold, leading to a problem of increased power consumption. Contrastingly, an arrangement employing the pulse generating circuit 40 according to the embodiment does not require the clock CLK to have such a raised frequency, thereby providing reduced power consumption.

Furthermore, such an arrangement includes the selector 50, which allows the two pulse signals PWM1 and PWM3 to be switched. Thus, such an arrangement is capable of adjusting the pulse width of the pulse signal to be output to a downstream circuit in increments of half cycles of the clock CLK.

Figure 3:
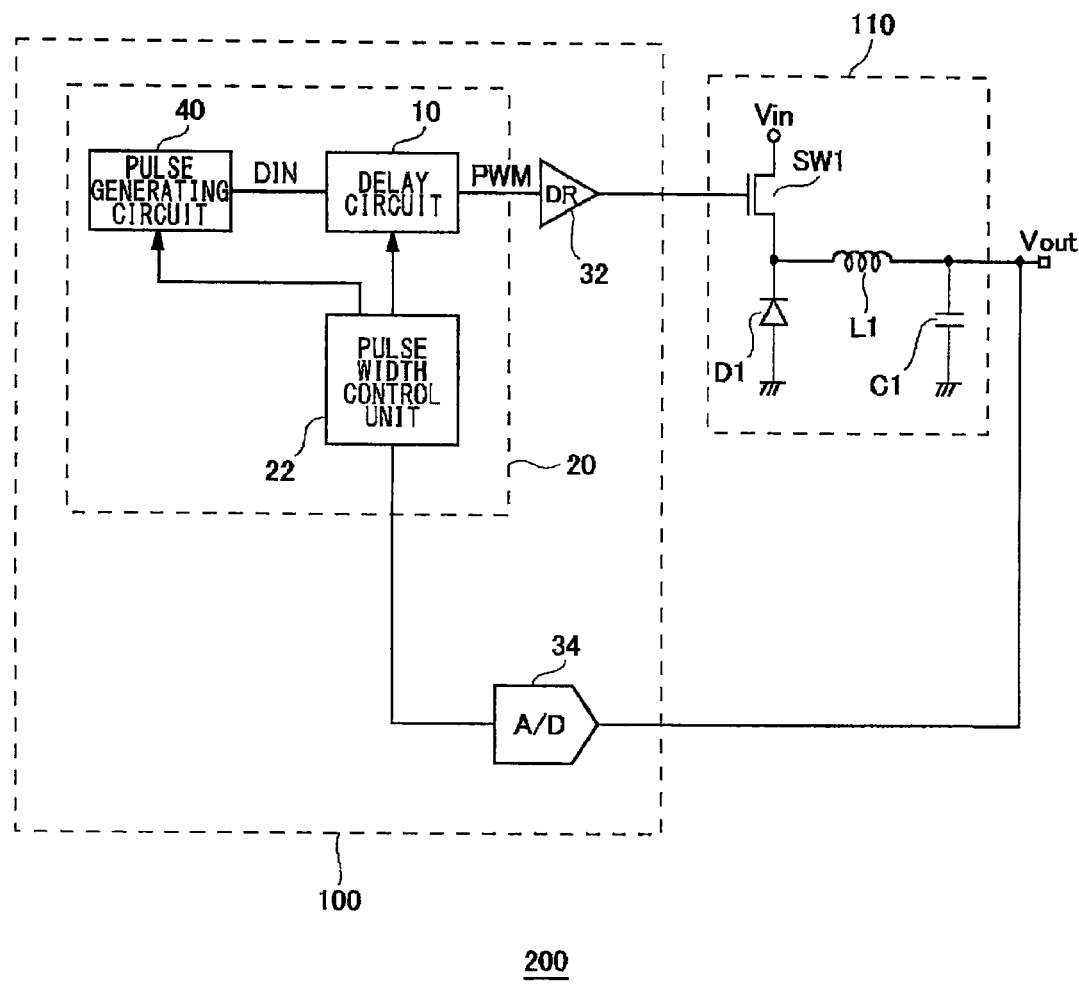
FIG. 3 is a block diagram which shows a configuration of a switching regulator including a pulse width modulator employing the pulse generating circuit shown in FIG. 1.

Next, description will be made regarding a suitable application of the pulse generating circuit 40. The pulse generating circuit 40 can be suitably applied to a pulse width modulator. FIG. 3 is a block diagram which shows a configuration of a switching regulator 200 including the pulse width modulator 20 employing the pulse generating circuit 40 shown in FIG. 1.

The switching regulator 200 is a step-down DC/DC converter which drops an input voltage Vin so as to generate an output voltage Vout, and which includes a control circuit 100 and an output circuit 110. The output circuit 110 has a typical topology including a switching element SW1, a rectifier diode D1, an inductor L1, and an output capacitor C1. Such an arrangement may include a synchronization rectifier transistor, instead of the rectifier diode D1. The output circuit 110 may have a booster topology.

The control circuit 100 includes the pulse width modulator 20, a driver 32, and an A/D converter 34. The A/D converter 34 converts the output voltage Vout of the switching regulator 200 into a digital value. The pulse width modulator 20 generates a pulse signal PWM adjusted such that the digital value approaches a predetermined value. The driver 32 drives the switching element SW1 using the pulse signal PWM.

The pulse width modulator 20 includes a pulse generating circuit 40, a delay circuit 10, and a pulse width control unit 22. The pulse generating circuit 40 generates a pulse signal DIN having a predetermined pulse width under the control of the pulse width control unit 22. The pulse generating circuit 40 has a configuration shown in FIG. 1. The delay circuit 10 delays the pulse signal DIN output from the pulse generating circuit 40, or performs fine adjustment of the pulse width of the pulse signal DIN.

The pulse width control unit 22 computes an optimum pulse width of the pulse signal PWM such that the output voltage Vout matches the target value. The pulse width control unit 22 controls the pulse generating circuit 40 and the delay circuit 10 so as to obtain a desired pulse width.

Figures 4A, 4B, 4C:
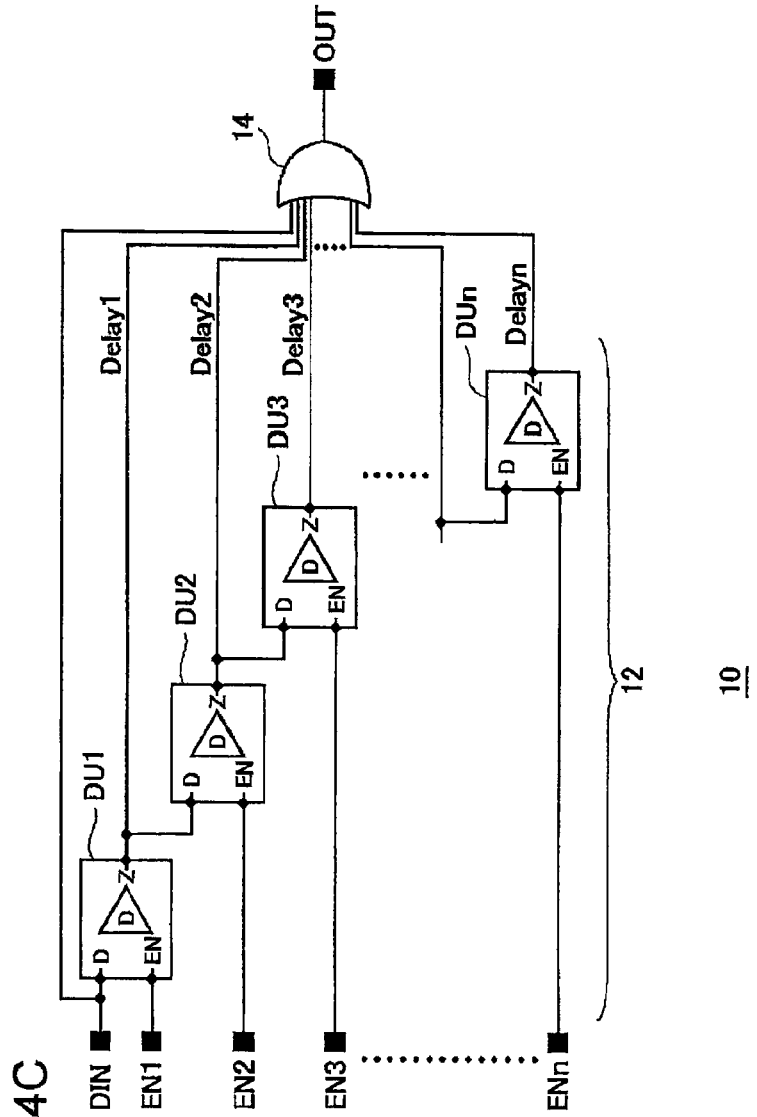
FIGS. 4A through 4C are circuit diagrams which show an example configuration of a delay circuit shown in FIG. 3.

FIGS. 4A through 4C are circuit diagrams which show an example configuration of the delay circuit 10. The delay circuit 10 applies a variable delay to the negative edges of the input pulse DIN so as to output an output signal OUT.

FIG. 4A shows a circuit symbol of a basic delay unit DU. The delay unit DU has an enable terminal EN, in addition to an input terminal D and an output terminal Z. When the enable signal EN input to the enable terminal is asserted (EN=1), the delay unit DU enters the active state. In the active state, the delay unit DU applies a predetermined unit delay D to the input signal input via the enable terminal D, and outputs the signal thus delayed via the output terminal Z. When the enable signal EN is negated (EN=0), the delay unit D is switched to the OFF state, and the output of the delay unit DU is set to the low level (=0). FIG. 4B is a logical value table for the delay unit DU.

The delay circuit 10 according to the embodiment shown in FIG. 4C includes a delay unit group 12 and a logic gate 14. The delay unit group 12 includes n (n is an integer of 2 or more) delay units DU1 through DUn. The multiple delay units DU are connected to one another in a cascade manner. Specifically, the input terminal D of the i-th ($2 \leq i \leq n$) delay unit DUi is connected to the output terminal Z of the upstream ((i−1)-th) delay unit DUi−1. The input pulse signal DIN is input to the input terminal D of the first delay unit DU1.

The logic gate 14 multiplexes the output signals Delay1 through Delay(n) of the multiple delay units DU1 through DUn and the input pulse DIN, and outputs the signal thus multiplexed as the output signal OUT. The logic gate 14 can be configured as an OR gate which outputs the logical OR of the multiple input signals.

Figure 5:
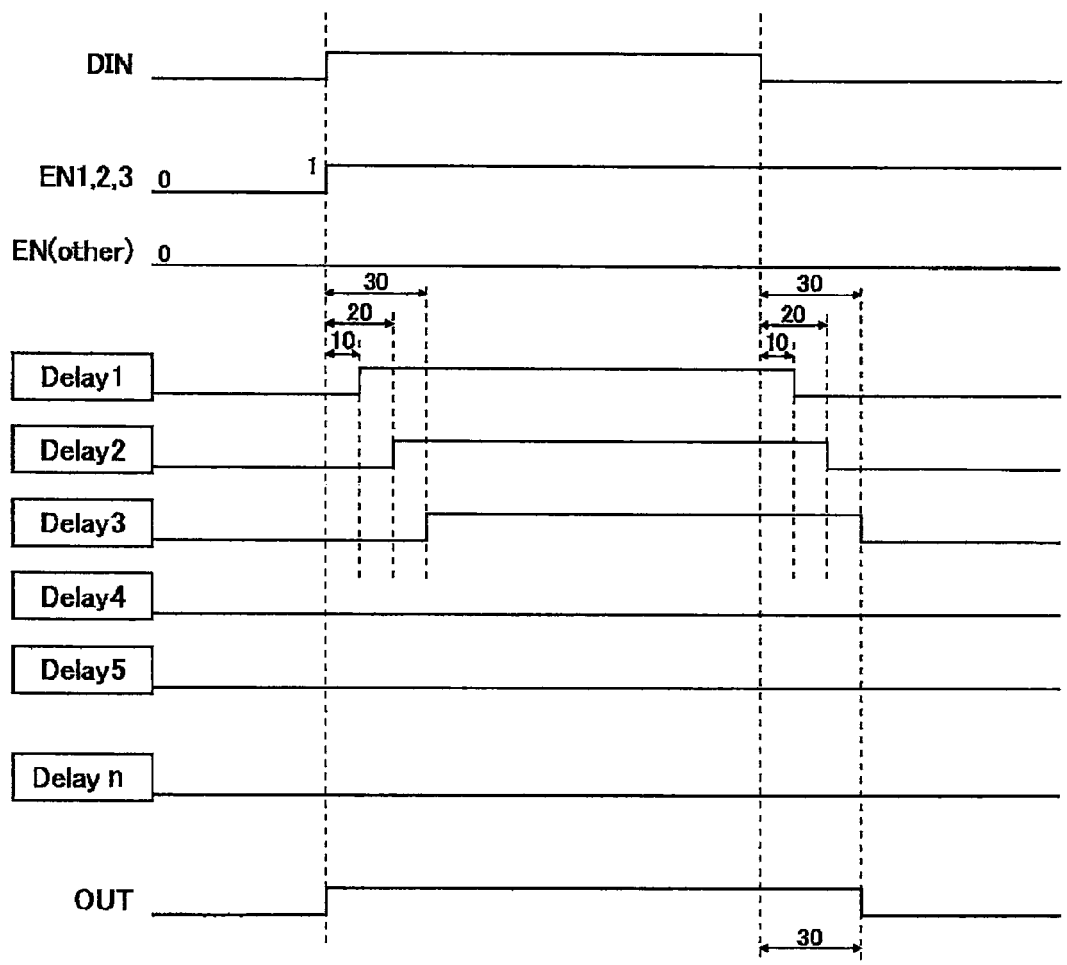
FIG. 5 is a time chart which shows the operation of the delay circuit shown in FIG. 4C.

The above is the configuration of the delay circuit 10. FIG. 5 is a time chart which shows the operation of the delay circuit 10 shown in FIG. 4C. The time chart in FIG. 5 shows an example in which the enable signals EN1 through EN3 are asserted, and the other enable signals are negated.

Each of the output signals Delay1 through Delay3 of the first through third delay units DU1 through DU3 is a signal obtained by delaying the output signal of the immediately-upstream delay unit by a unit time D. Each of the output signals Delay4 through Delay(n) of the delay units UD4 through Dun is set to the low level state. In this case, the output signal OUT of the logic gate 14 has a positive edge at the same timing as that of the positive edge of the input signal DIN, and a negative edge at a timing obtained by applying a delay of (3×D) to the negative edge of the input signal DIN.

With the delay circuit 10 shown in FIG. 1, a delay amount (k×D) can be applied to the negative edge by asserting k enable signals EN1 through ENk ($1 \leq k \leq n$), and by negating the other enable signals ENk+1 through ENn.

Furthermore, in this case, transition of the signal level does not occur in the (k+1)-th through n-th delay units DU. This prevents wasteful power consumption, thereby reducing the overall power consumption of the delay circuit 10.

The switching regulator 200 shown in FIG. 3 employs the pulse generating circuit 40 and the delay circuit 10, thereby reducing the power consumption of the internal components of the control circuit 100.

The usage of the delay circuit 10 shown in FIGS. 4A through 4C is not restricted to the switching regulator shown in FIG. 3. Rather, the delay circuit 10 can be used as a delay circuit for various kinds of circuits. In such usages, the delay circuit 10 also provides reduced power consumption.

While the preferred embodiments of the present invention have been described using specific terms, such description is for illustrative purposes only, and it is to be understood that changes and variations may be made without departing from the spirit or scope of the appended claims.

What is claimed is:

1. A pulse generating circuit comprising:
   a pulse generating unit which receives a clock at a predetermined frequency, and which generates a pulse signal which transits synchronously with one of the edges of the clock;
   an inverter which inverts the clock;
   a flip-flop which acquires the pulse signal every time one of the edges occurs in the inverted clock received from the inverter; and
   a logic gate which multiplexes the pulse signal and the output of the flip-flop.

2. A pulse generating circuit according to claim 1, further comprising a selector which selects either the output of the logic gate or the pulse signal.

3. A pulse generating circuit according to claim 1, wherein the pulse generating unit includes a counter which counts the aforementioned one of the edges of the clock, and which generates the pulse signal which is maintained at a predetermined level until the count value reaches a predetermined value.

4. A pulse generating circuit according to claim 2, wherein the pulse generating unit includes a counter which counts the aforementioned one of the edges of the clock, and which generates the pulse signal which is maintained at a predetermined level until the count value reaches a predetermined value.

5. A pulse width modulator comprising:
   a pluse generating circuit according to claim 3; and
   a pulse width control unit which sets the predetermined value for the pulse generating unit.

6. A pulse width modulator comprising:
   a pulse generating circuit according to claim 4; and
   a pulse width control unit which sets the predetermined value for the pulse generating unit.

7. A control circuit for a switching regulator, comprising:
   an A/D converter which converts the output voltage of the switching regulator into a digital value;
   a pulse modulator which generates a pulse signal having a pulse width adjusted such that the digital value output from the A/D converter approaches a predetermined target value; and
   a driver which drives a switching element included in the switching regulator using the pulse signal output from the pulse modulator,
   wherein the pulse modulator includes the pulse width modulator according to claim 5.

8. A control circuit for a switching regulator, comprising:
   an A/D converter which converts the output voltage of the switching regulator into a digital value;
   a pulse modulator which generates a pulse signal having a pulse width adjusted such that the digital value output from the A/D converter approaches a predetermined target value; and
   a driver which drives a switching element included in the switching regulator using the pulse signal output from the pulse modulator,
   wherein the pulse modulator includes the pulse width modulator according to claim 6.

* * * * *